US010756133B2

(12) United States Patent
Oshige

(10) Patent No.: US 10,756,133 B2
(45) Date of Patent: Aug. 25, 2020

(54) SEMICONDUCTOR DEVICE AND METHOD OF MANUFACTURING SEMICONDUCTOR DEVICE

(71) Applicant: CANON KABUSHIKI KAISHA, Tokyo (JP)

(72) Inventor: Hidemasa Oshige, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 103 days.

(21) Appl. No.: 15/998,539

(22) Filed: Aug. 16, 2018

(65) Prior Publication Data
US 2019/0057996 A1   Feb. 21, 2019

(30) Foreign Application Priority Data

Aug. 17, 2017 (JP) ................... 2017-157581

(51) Int. Cl.
H01L 27/146 (2006.01)
G05D 1/02 (2020.01)
H01L 31/0224 (2006.01)

(52) U.S. Cl.
CPC .. H01L 27/14636 (2013.01); H01L 27/14683 (2013.01); H01L 31/022408 (2013.01); G05D 1/0246 (2013.01); H01L 27/14643 (2013.01)

(58) Field of Classification Search
CPC ........ H01L 27/14636; H01L 27/14683; H01L 31/022408; H01L 27/14643; G05D 1/0246
USPC ...................................................... 250/208.1
See application file for complete search history.

(56) References Cited

U.S. PATENT DOCUMENTS

| 5,412,250 | A | 5/1995 | Brugge |
| 7,781,894 | B2 | 8/2010 | Oikawa |
| 7,999,356 | B2* | 8/2011 | Nakasaki .......... H01L 21/02274 |
| | | | 257/632 |
| 8,896,125 | B2* | 11/2014 | Kagawa ................ H01L 23/528 |
| | | | 257/774 |
| 9,337,125 | B2 | 5/2016 | Park et al. |
| 9,659,858 | B2 | 5/2017 | Mohammed et al. |
| 2007/0132017 | A1 | 6/2007 | Oikawa |
| 2013/0026645 | A1 | 1/2013 | Mohammed et al. |
| 2014/0070426 | A1 | 3/2014 | Park et al. |
| 2016/0013128 | A1 | 1/2016 | Aoyama et al. |

FOREIGN PATENT DOCUMENTS

| JP | 0228825 A | 11/1990 |
| JP | 09503098 A | 3/1997 |
| JP | 2007184553 A | 7/2007 |
| JP | 2012190826 A | 10/2012 |
| JP | 2014057065 A | 3/2014 |
| JP | 2014526149 A | 10/2014 |
| JP | 2016018899 A | 2/2016 |

* cited by examiner

Primary Examiner — Seung C Sohn
(74) Attorney, Agent, or Firm — Venable LLP

(57) ABSTRACT

A semiconductor device disclosed includes a semiconductor substrate, an electrode layer arranged over the semiconductor substrate, and a conductive member provided in an opening and electrically connected to the electrode layer, and the opening penetrates the semiconductor substrate and reaches the electrode layer. The conductive member includes a metal portion and a barrier metal portion provided between a side surface of the opening and the metal portion, the barrier metal portion includes a first layer and a second layer provided between the first layer and the metal portion, and the second layer is denser than the first layer.

20 Claims, 6 Drawing Sheets

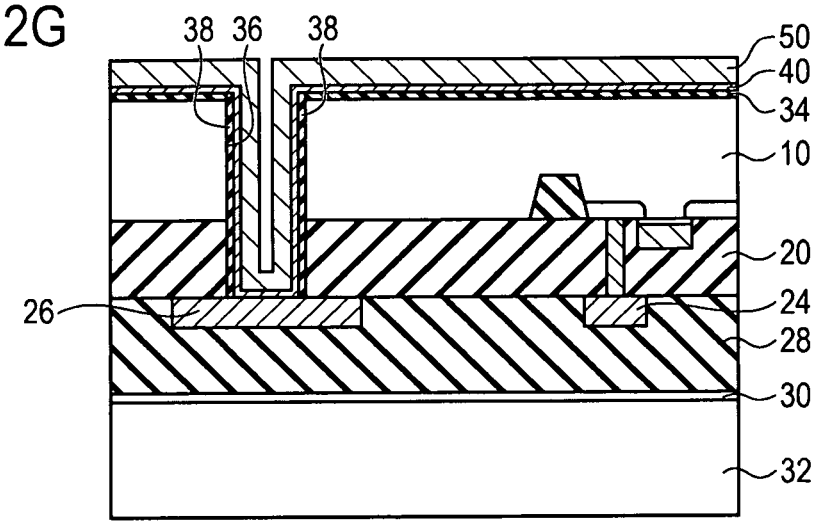
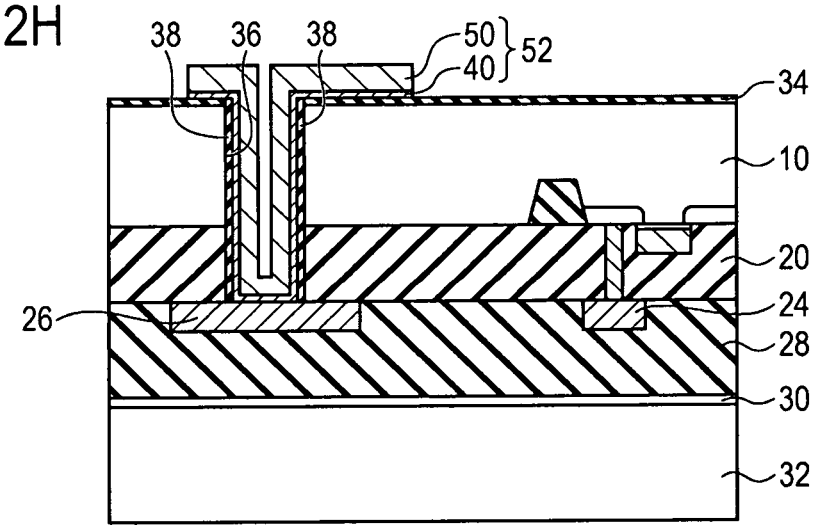
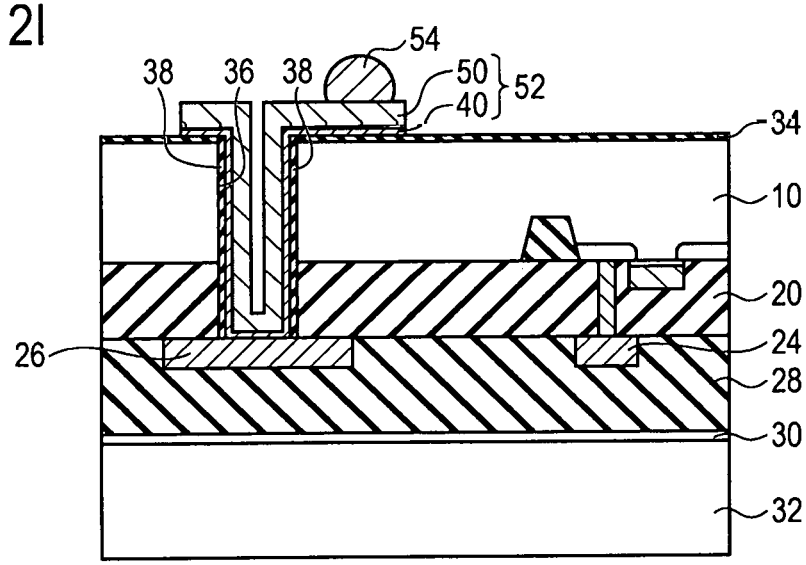

SEMICONDUCTOR DEVICE AND METHOD OF MANUFACTURING SEMICONDUCTOR DEVICE

BACKGROUND OF THE INVENTION

Field of the Invention

The present invention relates to a semiconductor device and a method of manufacturing the semiconductor device.

Description of the Related Art

A semiconductor device (a semiconductor chip) of a solid-state imaging device or the like includes, for example, a semiconductor substrate on which an element such as a transistor or the like is formed, an insulating layer arranged over the semiconductor substrate, and an interconnection portion arranged inside the insulating layer. The interconnection portion includes an interconnection pattern that connects one element to another, an interconnection pattern that supplies power to an element, and the like. Further, the semiconductor device further includes an electrode portion for an electrical connection to an external device (such as another semiconductor device or circuit substrate). A part of the interconnection portion is connected to the electrode portion.

When a semiconductor device is connected to an external device via flip-chip bonding, for example, an electrode portion referred to as a bump electrode is used. Some electrode portions may be formed over from the back surface side of the semiconductor substrate (the opposite side to the interconnection portion on the semiconductor substrate) to the interconnection portion. Such an electrode portion is arranged to penetrate inside the semiconductor substrate (for example, a silicon substrate) and also referred to as "through electrode."

A through electrode is formed as follows, for example. First, etching from the back surface side of a semiconductor substrate is performed to make a via-hole penetrating the semiconductor substrate and a part of an insulating layer and reaching an interconnection layer (a part to be connected to an external device) on the front surface side of the semiconductor substrate. Then, an insulating layer is formed on the back surface of the semiconductor substrate and the side surface of the via-hole. Then, a conductive member is arranged in the via-hole to form a through electrode electrically connected to the interconnection layer.

As a method of forming a via-hole to penetrate a semiconductor substrate, an etching method which is called the Bosch method is known. It is known that a periodical concave and convex (uneven) shape that is referred to as a scallop occurs on the side surface of the via-hole which is formed by the Bosch method. When a scallop shape is formed on the side surface of the via-hole, this reduces the coverability of an insulating layer for insulation between a through electrode and a semiconductor substrate or a barrier metal portion that prevents a metal material forming the through electrode from diffusing into the semiconductor substrate. Reduction in coverability of an insulating layer or a barrier metal portion may cause degradation in characteristics or reduction in reliability of a semiconductor device.

Japanese Patent Application Laid-Open No. 2012-190826 discloses a technique to improve the coverability of an insulating layer and a barrier metal portion by embedding a resin in a concave part on the side surface of the via-hole formed by the Bosch method to smooth the concave and convex shape of the side surface.

However, since the technique disclosed in Japanese Patent Application Laid-Open No. 2012-190826 requires a separate step of filling a resin in a via-hole and a step of removing an unnecessary resin, the number of steps is increased, which in turn may cause increase of a manufacturing cost. Further, a larger aspect ratio of a via-hole makes it difficult to fill a resin to the bottom portion of the via-hole, and the unevenness of the side surface of the via-hole cannot be sufficiently smoothed. Further, although a method other than the Bosch method is also known as a method of forming a via-hole, the productivity of the known method is low, because the etching rate is low compared to the Bosch method and formation of a via-hole requires long time.

SUMMARY OF THE INVENTION

The present invention intends to provide a semiconductor device and a method of manufacturing the same capable of suppressing degradation in characteristics or reduction in reliability of a semiconductor device without decreasing productivity.

According to an aspect of the present invention, there is provided a semiconductor device including a semiconductor substrate, an electrode layer arranged over the semiconductor substrate, and a conductive member provided in an opening and electrically connected to the electrode layer, the opening penetrating the semiconductor substrate and reaching the electrode layer, wherein the conductive member includes a metal portion and a barrier metal portion provided between a side surface of the opening and the metal portion, and wherein the barrier metal portion includes a first layer and a second layer provided between the first layer and the metal portion, and the second layer is denser than the first layer.

According to another aspect of the present invention, there is provided a semiconductor device including a semiconductor substrate, an electrode layer arranged on over the semiconductor substrate, and a conductive member provided in an opening and electrically connected to the electrode layer, the opening penetrating the semiconductor substrate and reaching the electrode layer, wherein the conductive member has includes a metal portion and a barrier metal portion provided between a side surface of the opening and the metal portion, and wherein a vacant gap is arranged between the metal portion and the side surface, and the barrier metal portion is arranged between the vacant gap and the metal portion.

Further features of the present invention will become apparent from the following description of exemplary embodiments with reference to the attached drawings.

BRIEF DESCRIPTION OF THE DRAWINGS

FIG. 2A, FIG. 2B, FIG. 2C, FIG. 2D, FIG. 2E, FIG. 2F, FIG. 2G, FIG. 2H and FIG. 2I are cross-sectional views illustrating a method of manufacturing the semiconductor device according to the first embodiment of the present invention.

DESCRIPTION OF THE EMBODIMENTS

Preferred embodiments of the present invention will now be described in detail in accordance with the accompanying drawings.

First Embodiment

A semiconductor device and a method of manufacturing the same according to a first embodiment of the present invention will be described with reference to FIG. 1A to FIG. 3B.

Figure 1A:
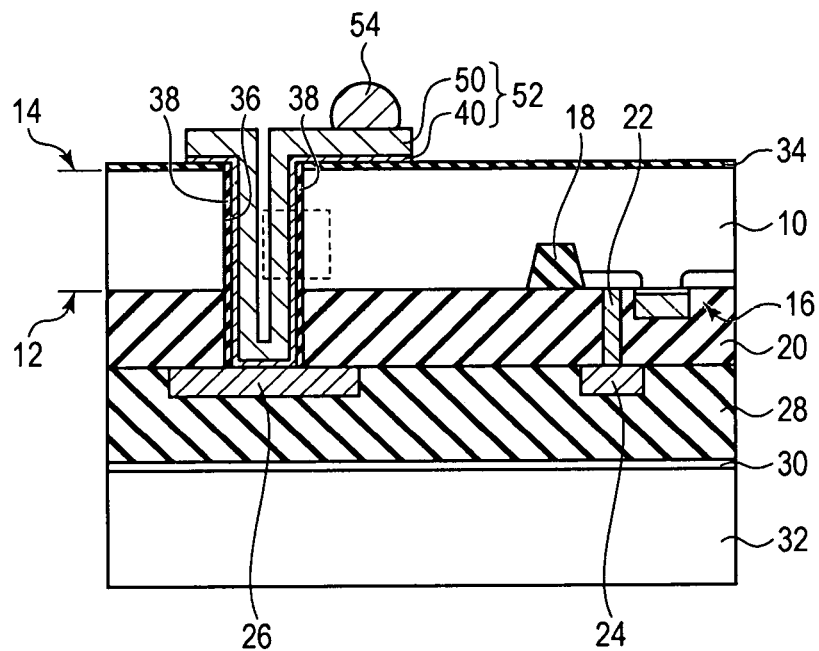
FIG. 1A and FIG. 1B are schematic cross-sectional views illustrating the structure of a semiconductor device according to a first embodiment of the present invention.
Figure 1B:
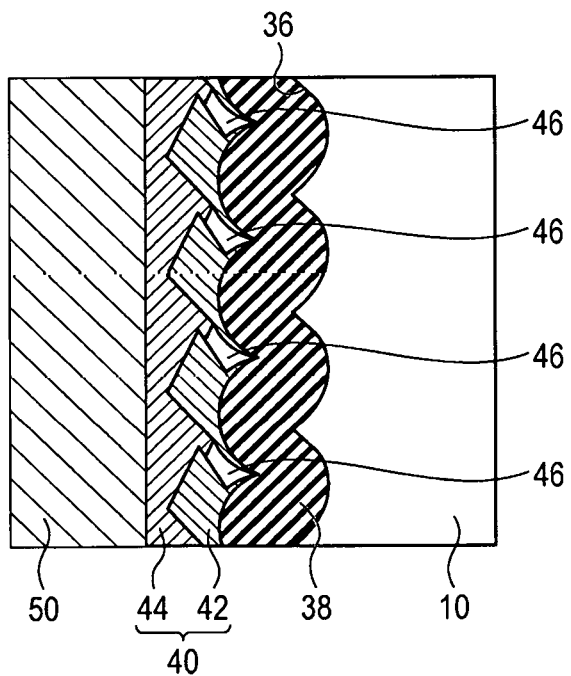

First, the structure of the semiconductor device according to the present embodiment will be described by using FIG. 1A and FIG. 1B. FIG. 1A is a schematic cross-sectional view illustrating the structure of the semiconductor device according to the present embodiment. FIG. 1B is an enlarged view of the area surrounded by a dotted line in FIG. 1A.

As illustrated in FIG. 1A, the semiconductor device according to the present embodiment includes a semiconductor substrate 10. A semiconductor element 16 is provided on the side of a first surface 12 that is one surface of the semiconductor substrate 10. An interlayer insulating film 20 is provided over the first surface 12 of the semiconductor substrate 10 on which the semiconductor element 16 is provided. A contact plug 22 electrically connected to the semiconductor element 16 is arranged in the interlayer insulating film 20. An interconnection layer 24 electrically connected to the semiconductor element 16 via the contact plug 22 and an electrode layer 26 that is an electrode portion for electrical connection to an external device are provided on the interlayer insulating film 20. An interlayer insulating film 28 is provided over the interlayer insulating film 20. A support substrate 32 is laminated via an adhesive layer 30 over the interlayer insulating film 28.

A via-hole 36 that is an opening reaching the electrode layer 26 is provided in the semiconductor substrate 10 and the interlayer insulating film 20. The via-hole 36 penetrates the semiconductor substrate 10 and the interlayer insulating film 20 from a second surface 14 and reaches the electrode layer 26. An insulating film 34 is provided over the second surface 14 of the semiconductor substrate 10. An insulating film 38 is provided on a side surface of the via-hole 36. A conductive member is arranged in the via-hole 36 on which the insulating film 38 is provided. This conductive member is a through electrode 52 arranged to penetrate the semiconductor substrate 10. One end portion of the through electrode 52 is electrically connected to the electrode layer 26, and the other end portion extends on the insulating film 34 arranged over the second surface 14 of the semiconductor substrate 10. A solder ball 54 as an external connection terminal is provided on the other end portion of the through electrode 52.

The semiconductor substrate 10 is a silicon substrate, for example. The semiconductor element 16 is an element that realizes a predetermined function of the semiconductor device and includes a MOS transistor, a diode, or the like. In a solid-state imaging device, for example, a photodiode forming a photoelectric conversion element, a MOS transistor forming a readout circuit that reads out a signal based on charges generated in the photoelectric conversion element, or the like is provided. An element other than the semiconductor element 16, for example, a capacitor element or a resistor element may be further provided on the semiconductor substrate 10. The interlayer insulating films 20 and 28 are provided over the entire surface on the side of the first surface 12 of the semiconductor substrate 10 including the semiconductor element 16 and are made of an insulating material such as silicon oxide, silicon nitride, for example.

The interconnection layer 24 is a layer in which an interconnection pattern connecting elements to each other, an interconnection pattern supplying electric power to elements, or the like is arranged in the interlayer insulating films 20 and 28. Although FIG. 1A illustrates only one interconnection layer 24, a plurality of the interconnection layers may be arranged. In such a case, the interconnection layers are mutually connected by via-plugs. The interconnection layer 24 can be formed of a conductive material mainly composed of a metal such as copper (Cu) or aluminum (Al), for example. The contact plug 22 can be made of a metal material such as tungsten, for example. The contact plug 22 may further include a barrier metal portion made of a conductive material such as titanium (Ti), tantalum (Ta), titanium nitride (TiN), tantalum nitride (TaN), or the like such that the constituent metal does not diffuse into the semiconductor substrate 10.

The electrode layer 26 is an extraction electrode portion electrically connected to a part of the interconnection pattern of the interconnection layer 24. The electrode layer 26 can be formed of a conductive material mainly composed of a metal such as copper, aluminum, or the like in the same manner as the interconnection layer 24. In terms of reduction of processes, it is preferable that the electrode layer 26 be formed of the same layer and the same material as any layer of the interconnection layer 24. However, the electrode layer 26 is not necessarily the same layer as any layer of the interconnection layer 24 and may be formed of a different layer than the interconnection layer 24.

The insulating films 34 and 38 are insulating members used for maintaining insulation between the semiconductor substrate 10 and the through electrode 52. As the insulating films 34 and 38, an insulating material such as silicon oxide, silicon nitride, or the like can be used, for example. The insulating films 34 and 38 may be omitted, and the through electrode 52 may be in contact with the semiconductor substrate 10 (the side surface of the via-hole 36). In that case, by providing a trench surrounding the through electrode 52 on the semiconductor substrate 10, the through electrode 52 and the semiconductor element can be electrically separated.

The through electrode 52 includes a barrier metal portion 40 formed along the side surface and the bottom surface of the via-hole 36 and a metal portion 50 provided on the barrier metal portion 40. The through electrode 52 extends from the second surface 14 side of the semiconductor substrate 10 to the electrode layer 26 arranged on the first surface 12 side of the semiconductor substrate 10. The metal portion 50 can be formed of a metal material including at least one selected from a group including Cu, gold (Au), Al, nickel (Ni), and tungsten (W), for example.

Note that the drawings of the present application are conceptual diagrams drawn for easier understanding of the structure of each portion, and the ratio of the size of each portion does not necessarily conform to the actual scale of the semiconductor device. In an actual semiconductor device, for example, while the thickness of the interlayer insulating film 20 is, for example, about several microns or less, the thickness of the semiconductor substrate 10 is, for example, several tens of microns or more.

The structure of the through electrode 52 will be more specifically described by using FIG. 1B. On the side surface of the via-hole 36, as illustrated in FIG. 1B, a periodical concave and convex shape that is referred to as a scallop is formed. The concave and convex shape is the characteristic shape generated when the via-hole 36 is formed on the semiconductor substrate 10 by an etching method that is referred to as the Bosch method. The etching method of the semiconductor substrate 10 using the Bosch method will be described later. On the surface of the insulating film 38, the concave and convex shape reflecting the scallop shape on the side surface of the via-hole 36 is formed.

The barrier metal portion 40 includes a first layer 42 and a second layer 44. The first layer 42 and the second layer 44 are provided on the surface of the insulating film 38 in this order. As the first layer 42 and the second layer 44 of the barrier metal portion 40, a conductive material which can suppress the diffusion of the metal material forming the metal portion 50, for example, a conductive material including at least one selected from a group including Ti, Ta, TiN, and TaN can be applied. The metal portion 50 is provided on the surface of the second layer 44 of the barrier metal portion 40.

The first layer 42 of the barrier metal portion 40 has a discontinuous shape in which the film thickness on the convex parts of the surface of the insulating film 38 is large and the film thickness on the concave parts of the surface of the insulating film 38 is small. On the other hand, the second layer 44 of the barrier metal portion 40 is evenly provided on the side surface of the via-hole 36 on which the insulating film 38 and the first layer 42 are provided. Thereby, vacant gaps 46 surrounded by the first layer 42 and the second layer 44 exists inside the barrier metal portion 40. The second layer 44 is continuously provided along the side surface and the bottom surface of the via-hole 36, and the vacant gaps 46 are covered by the second layer 44. This can prevent the metal portion 50 from being directly in contact with the insulating film 38. Further, since the metal material forming the metal portion 50 cannot diffuse into the vacant gap 46, even when the vacant gap 46 exists in the first layer 42, the barrier metal portion 40 can maintain a high metal diffusion prevention performance as a whole.

If the metal portion 50 were provided on the first layer 42 without the second layer 44 being provided, the metal material forming the metal portion 50 would drain into the vacant gap 46 when the metal portion 50 is formed and may come in contact with the insulating film 38. In this regard, in the semiconductor device according to the present embodiment, since the vacant gaps 46 are covered by the second layer 44, a contact of the metal material forming the metal portion 50 to the insulating film 38 in the process of forming the metal portion 50 can be effectively suppressed.

The second layer 44 is denser than the first layer 42. In other words, the first layer 42 is coarser than the second layer 44. Further, the first layer 42 has an intermittent shape provided with the vacant gaps 46 and is a film with a low film stress and with a less film density compared to the second layer 44. Thus, the barrier metal portion 40 also has a feature that the film density is low and the film stress is small as a whole. It is therefore possible to suppress a problem arising due to a large film stress of the barrier metal portion 40, for example, peeling off of the barrier metal portion 40 or the metal portion 50 from the side surface of the via-hole 36, damaging the device on the first surface 12 side of the semiconductor substrate 10, or the like.

Next, a method of manufacturing the semiconductor device according to the present embodiment will be described by using FIG. 2A to FIG. 3B. FIG. 2A to FIG. 3B are cross-sectional views illustrating a method of manufacturing the semiconductor device according to the present embodiment. Note that known semiconductor manufacturing processes can be used for manufacturing the semiconductor device. Further, although the description is omitted here, other steps, for example, a heat treatment step, a cleaning treatment step, or the like may be performed if necessary during each step described later.

Figure 2A:
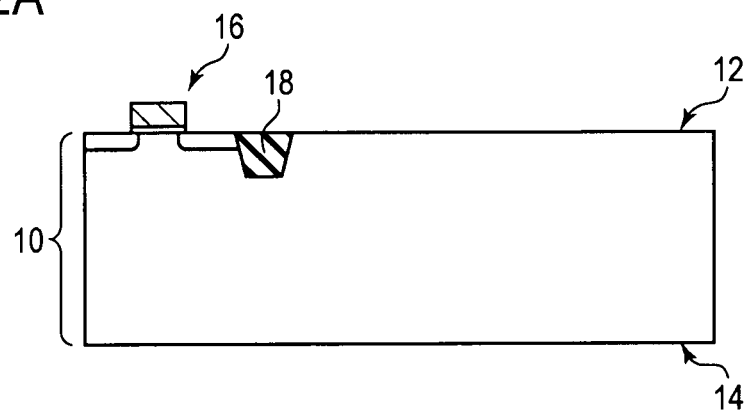

First, a predetermined semiconductor element 16 corresponding to a semiconductor device to be manufactured is formed on the first surface 12 side that is one surface of the semiconductor substrate 10 (FIG. 2A). On the semiconductor substrate 10, an element isolating portion 18 may be formed by using a Shallow Trench Isolation (STI) method or the like. Each semiconductor element 16 can be electrically isolated from other adjacent elements by the element isolating portion 18. FIG. 2A illustrates a MOS transistor as an example of the semiconductor element 16 provided in an active region defined by the element isolating portion 18.

Next, the interlayer insulating film 20 is formed by depositing an insulating material such as silicon oxide, silicon nitride, silicon oxynitride, or the like by a CVD method over the semiconductor substrate 10 in which the semiconductor element 16 is provided.

Next, the contact plug 22 electrically connected to the semiconductor element 16 is formed in the interlayer insulating film 20. For example, after a contact hole which reaches the electrode of the semiconductor element 16 in the interlayer insulating film 20 is formed, the contact plug 22 is formed by filling a conductive material such as tungsten in the contact hole.

Figure 2B:
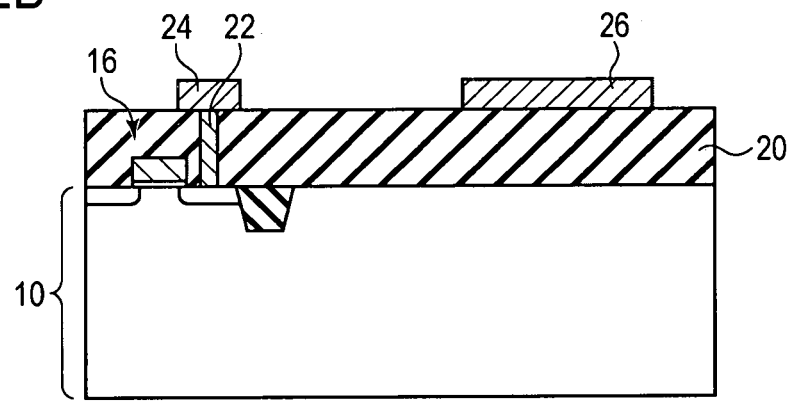

Next, the interconnection layer 24 and the electrode layer 26 electrically connected to the semiconductor element 16 via the contact plug 22 are formed over the interlayer insulating film 20 (FIG. 2B). The interconnection layer 24 and the electrode layer 26 can be formed of a metal material mainly composed of aluminum or copper. For example, after a conductive layer mainly composed of aluminum having a film thickness of 300 nm is deposited by a sputtering method, for example, the interconnection layer 24 and the electrode layer 26 are formed by patterning this conductive layer.

Next, the interlayer insulating film 28 is formed over the interlayer insulating film 20 on which the interconnection layer 24 and the electrode layer 26 are provided. As the interlayer insulating film 28, an insulating material such as silicon oxide, silicon nitride, silicon oxynitride, or the like can be applied.

As described above, the semiconductor substrate 10 on which the semiconductor element 16, the interconnection layer 24, the electrode layer 26, the interlayer insulating films 20 and 28, and the like are provided is prepared on the first surface 12.

Next, if necessary, the support substrate 32 is laminated via the adhesive layer 30 on the first surface 12 side of the semiconductor substrate 10 formed of the semiconductor element 16, the interconnection layer 24, the electrode layer 26, the interlayer insulating films 20 and 28, and the like. The support substrate 32 is not limited in particular but can be a quartz glass substrate having a thickness of 0.5 mm, for example.

Figure 2C:
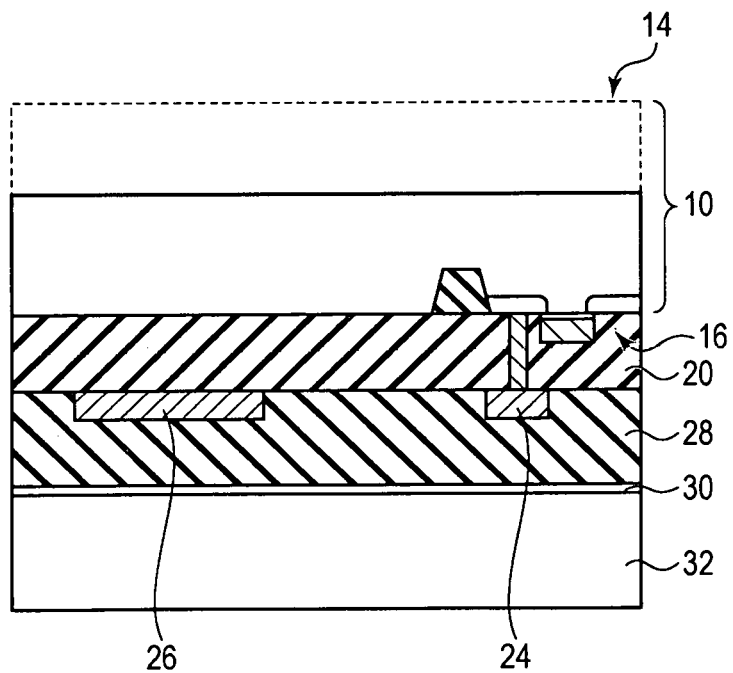

Next, if necessary, a back grinding process of the semiconductor substrate 10 is performed from the second surface 14 side of the semiconductor substrate 10, which is the surface opposite to the first surface 12, to thin the semiconductor substrate 10 (FIG. 2C). By the back grinding process, for example, the thickness of the semiconductor substrate 10 is thinned to about 200 μm. By making the semiconductor substrate 10 thin, the through electrode 52 is easily formed in a later step, which is preferable. Note that, in the present specification, a new surface appearing by the back grinding process of the second surface 14 of the semiconductor substrate 10 is also referred to as a second surface 14 in the same manner as before the back grinding.

Next, on the second surface 14 of the semiconductor substrate 10, after an insulating film 34 such as silicon nitride film is deposited, for example, by a plasma CVD method, the insulating film 34 is patterned by using photolithography and dry etching. This forms an insulating film 34 having an opening in a planned formation area of the through electrode 52. The insulating film 34 is a film used as a mask when forming the via-hole 36 and at least has a film thickness that does not disappear by the etching when forming the via-hole 36.

Figure 2D:
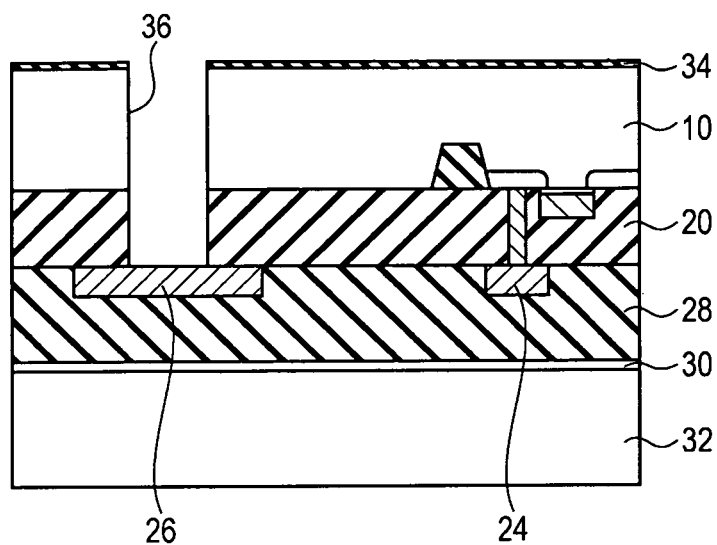

Next, the insulating film 34 is used as a mask to sequentially dry-etch the semiconductor substrate 10 and the interlayer insulating film 20 from the second surface 14 side of the semiconductor substrate 10 and form the via-hole 36 reaching the electrode layer 26 (FIG. 2D).

The via-hole 36 can be formed by two-step etching of a step of etching the semiconductor substrate 10 and a step of etching the interlayer insulating film 20, for example.

The semiconductor substrate 10 can be etched by dry etching using so-called the Bosch method, for example. By dry etching using the Bosch method, a vertical through hole can be easily formed on the surface of the semiconductor substrate 10. In dry etching using the Bosch method, since the etching rate of silicon oxide or silicon nitride is considerably small compared to the etching rate of silicon, it is possible to stop etching at a timing when the interlayer insulating film 20 is exposed.

The Bosch method is a method in which three steps of (1) an isotropic etching step, (2) a protective film deposition step, and (3) a protective film removal step of removing the protective film at the via bottom surface are included in one cycle and each step is quickly switched in a short time to repeat the cycle. In the isotropic etching step, a gas such as $SF_6$ is used, and the etching is mainly progressed using radicals as a reactive species. Since this step being performed for a long time may cause a large side-etching, switching to the protective film deposition step is performed in a short time (about several seconds). In the protective film deposition step, a CF polymerized film is deposited by decomposing a gas such as $C_4F_8$ in plasma. In this step, switching to the next step is performed in a short time of about several seconds. In the protective film removal step at the via bottom surface, a gas such as $SF_6$ is used to apply relatively high bias power to the stage side where the semiconductor substrate 10 is mounted, and thereby, anisotropic ions enter the semiconductor substrate 10 and the protective film of the via bottom surface is removed. At this time, ions hardly enter the side surface portion, the protective film on the side surface is not removed. Thereby, the protective film on the bottom of the via-hole can be selectively removed. In an isotropic etching step in the next cycle, the side surface portion is protected from etching by the protective film, and etching is proceeded only on the bottom surface of the via-hole 36. Repetition of this cycle enables etching that gradually proceeds vertically in the depth direction of the semiconductor substrate 10.

Since the three steps described above are repeated as one cycle in the Bosch method, periodical unevenness that is referred to as a scallop occurs on the side surface of the formed via-hole 36. A longer time of the isotropic etching step results in a larger scallop. When the isotropic etching step is shortened to reduce the size of the scallop, the etching rate decreases, and the processing time required for forming the via-hole 36 becomes longer. It is desirable to set the etching condition of the via-hole 36 appropriately in accordance with the allowable range of the scallop size and processing time. In the present embodiment, the etching condition is set such that the scallop size becomes about 300 nm.

The interlayer insulating film 20 can be etched by a capacitively coupled RIE using a $CF_4/C_4F_8/O_2/Ar$ mixed gas as an etching gas, for example.

Thus, the via-hole 36 penetrating the semiconductor substrate 10 and the interlayer insulating film 20 is formed, and the electrode layer 26 is exposed at the bottom portion of the via-hole 36.

Next, the insulating film 38 is formed on the second surface 14 side of the semiconductor substrate 10 including the side surface and the bottom surface (the exposed surface of the electrode layer 26) of the via-hole 36. As the insulating film 38, an insulating material such as silicon oxide, silicon nitride, or the like can be applied. For example, silicon oxide is deposited by a plasma CVD method using tetraethoxysilane (TEOS) as a source gas, and the insulating film 38 made of silicon oxide is formed.

Figure 2E:
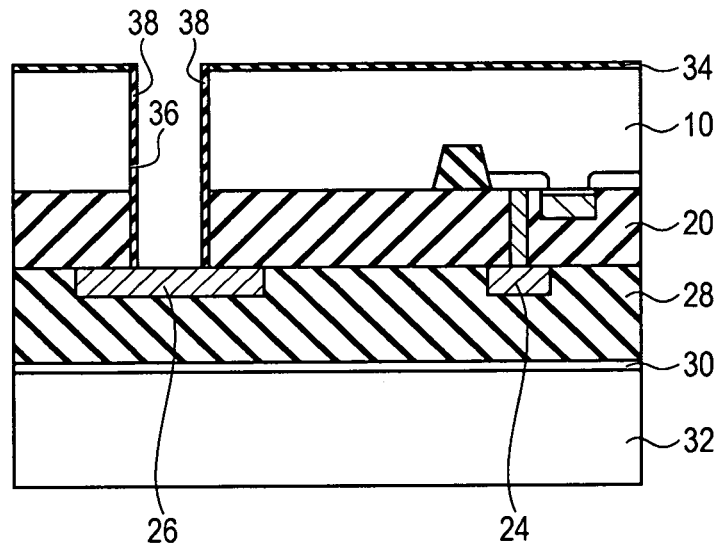

Next, the insulating film 38 is etched back by using dry-etching to remove the insulating film 38 on the bottom surface of the via-hole 36 while leaving the insulating film 38 on the side surface of the via-hole 36 (FIG. 2E). At this time, the insulating film 38 on the second surface 14 of the semiconductor substrate 10 may not be necessarily required to be completely removed. This exposes the electrode layer 26 on the bottom surface of the via-hole 36.

Figure 2F:
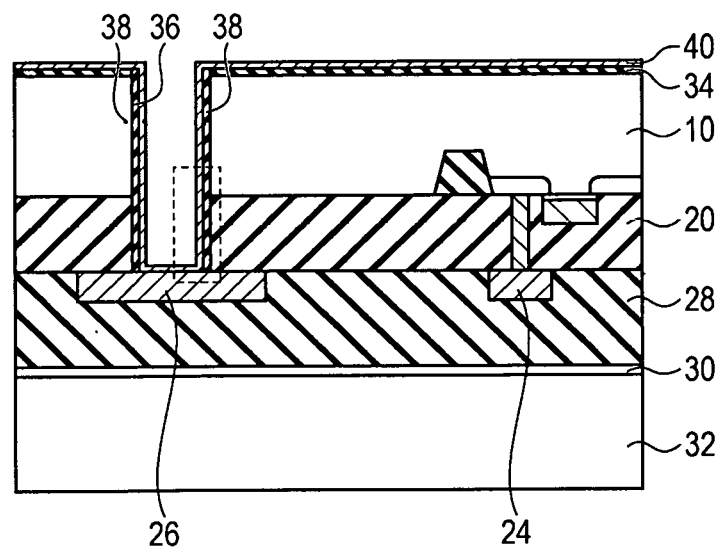

Next, the barrier metal portion 40 is formed on the second surface 14 side of the semiconductor substrate 10 including the side surface and the bottom surface (the exposed surface of the electrode layer 26) of the via-hole 36 (FIG. 2F). As the barrier metal portion 40, a conductive material such as Ti, Ta, TiN, TaN, or the like can be applied.

In the present embodiment, the barrier metal portion 40 is formed by using a bias sputtering method and by performing two-step film formation in which the substrate bias conditions are changed.

As described above, the concave and convex structure that is referred to as a scallop is formed on the side surface of the via-hole 36. Also on the surface of the insulating film 38 which covers the side surface of the via-hole 36, the unevenness reflecting the scallop shape of the via-hole 36 is formed. Therefore, in a deposition method with high directivity of sputtering particles, such as a long throw sputtering method, a collimation sputtering method, or the like, it is difficult to deposit a film on the surface of the concave part which is in the shade when viewed from the opening of the via-hole 36 that the sputtering particles enter.

On the other hand, a bias sputtering method is a film forming method that applies high-frequency power not only to the sputtering target side but also to a stage side where a semiconductor substrate to be processed is mounted. By setting an appropriate bias voltage applied to the stage side, a sputtered film deposited on the bottom surface of the via-hole 36 is reverse-sputtered, and a film can be deposited also on the surface of the concave parts facing the bottom surface side of the via-hole 36. On the other hand, the bias sputtering method has a problem that, when a substrate bias becomes larger than a certain value, the films deposited on the bottom surface of the via-hole 36 and on the upper corner portion of the via-hole 36 disappear, and the insulating film 34 or the electrode layer 26 underlying is scraped.

Accordingly, in the present embodiment, the barrier metal portion 40 is formed of a film to be a first layer 42 deposited under a first condition in which the substrate bias is set low and a film to be a second layer 44 deposited under a second condition in which the substrate bias is set high. Since the film to be the first layer 42 and the film to be the second layer 44 can be deposited by merely changing the substrate bias conditions, coverability of the barrier metal portion 40 can be improved without decreasing productivity.

Figure 3A:
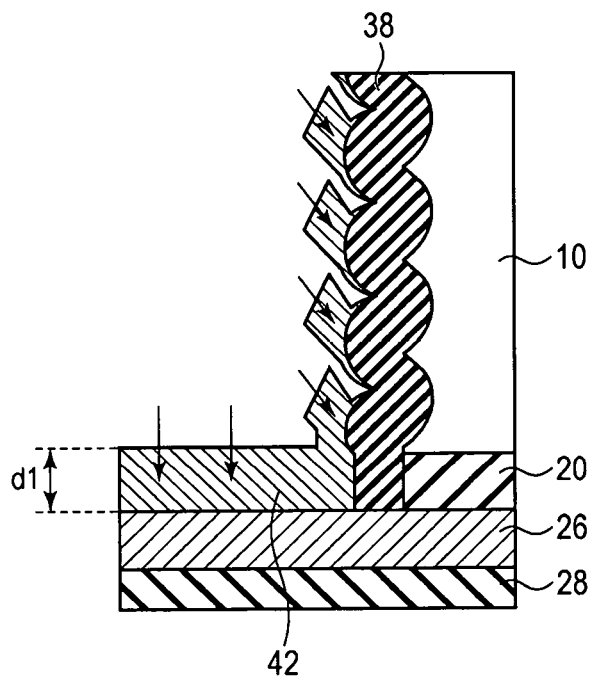
FIG. 3A and FIG. 3B are enlarged cross-sectional views illustrating the method of manufacturing the semiconductor device according to the first embodiment of the present invention.
Figure 3B:
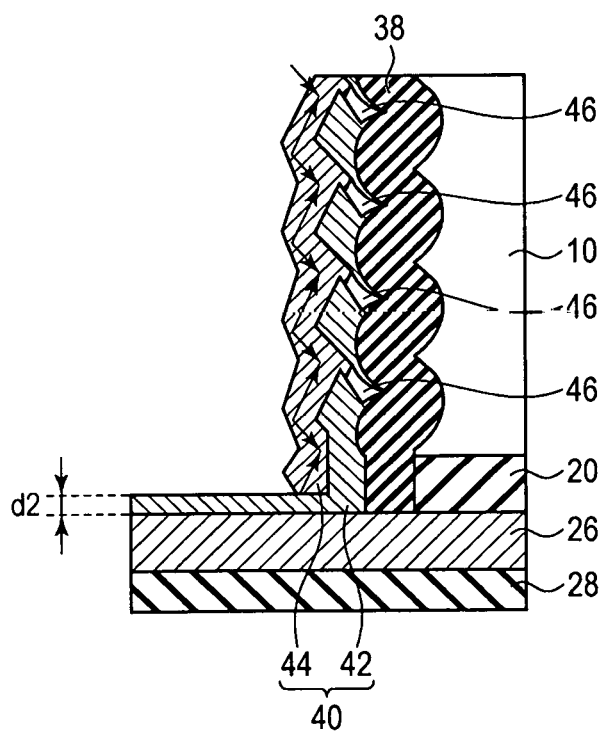

FIG. 3A and FIG. 3B are enlarged cross-sectional views inside a frame surrounded by a dotted line in FIG. 2F. FIG. 3A illustrates a state immediately after forming the film to be the first layer 42, and FIG. 3B illustrates a state immediately after forming the film to be the second layer 44.

First, in the process of forming the film to be the first layer 42, the substrate bias is set to a lower value to decrease the reverse sputtering effect such that the underlying electrode layer 26 is not scraped, and thereby, a film whose film thickness on the bottom surface of the via-hole 36 is d1 is formed as the first layer 42 (FIG. 3A). For example, the substrate bias is set to 100 W, and the first layer 42 made of titanium is formed such that the film thickness d1 becomes 300 nm.

Under the deposition condition of the film to be the first layer 42, as the direction of incidence of sputtering particles is indicated by the arrows in FIG. 3A, the reverse sputtering components are less, and the incidence of the sputtering particles from the opening of the via-hole 36 is dominant. Consequently, the film to be the first layer 42 grows upward the via-hole 36. Since unevenness reflecting the scallop shape of the via-hole 36 exists on the surface of the insulating film 38 covering the side surface of the via-hole 36, the film grows upward the via-hole 36 at the convex part, while almost no film is deposited at the concave part. Consequently, the film to be the first layer 42 is formed in a discontinuous state where a gap exists in a position corresponding to the concave part of the insulating film 38 as illustrated in FIG. 3A.

Next, in the process of forming the film to be the second layer 44, the substrate bias is set to a higher value to increase the reverse sputtering effect, and a film to be the second layer 44 is formed while the reverse sputtering of the first layer 42 deposited on the bottom surface of the via-hole 36 is performed (FIG. 3B). For example, the substrate bias is set to 300 W, and the second layer 44 is formed such that the film thickness d2 of the film to be the first layer 42 on the bottom surface of the via-hole 36 becomes 100 nm.

Under the deposition condition of the film to be the second layer 44, as the direction of incidence of sputtering particles is indicated by the arrows in FIG. 3B, the sputtering particles are incident also from the side of the bottom surface of the via-hole 36 in addition to the incidence of the sputtering particles from the opening side of the via-hole 36. Consequently, a sputtered film (a film to be the second layer 44) is deposited not only on the surface on the opening side of the via-hole 36 of the first layer 42 but also on the surface on the bottom surface side of the via-hole 36 of the first layer 42.

Thus, the gap of the first layer 42 formed in the position corresponding to the concave part of the insulating film 38 is covered by the second layer 44. The vacant gaps 46 surrounded by the first layer 42 and the second layer 44 remain in the barrier metal portion 40 formed of the first layer 42 and the second layer 44.

The film thickness d2 is thinner than the film thickness d1 due to the influence of reverse sputtering of the first layer 42 of the bottom surface of the via-hole 36 in the forming step of the second layer 44. To form a barrier metal portion 40 on the bottom surface of the via-hole 36 with a desirable film thickness d2, the film thickness d1 of the first layer 42 after forming the film to be the first layer 42 and the substrate bias in the forming step of the film to be the second layer 44 may be set appropriately. Although the second layer 44 is not illustrated on the bottom surface of the via-hole 36 in FIG. 3B, a film to be the second layer 44 may be deposited on the bottom surface of the via-hole 36.

Next, on the barrier metal portion 40 including the inside the via-hole 36, the metal portion 50 made of a metal material such as aluminum, copper, or the like is formed, for example, by a sputtering method (FIG. 2G). Considering coverability for the scallop, it is desirable that the metal portion 50 be deposited by a bias sputtering method similarly to the barrier metal portion 40. When the bias sputtering method is used, the substrate bias may be set appropriately such that the film thickness of the barrier metal portion 40 on the bottom surface of the via-hole 36 is not thinner than the desirable thickness.

If necessary, electrolytic plating may be performed by using the metal portion 50 as a seed layer to increase the film thickness of the metal portion 50. According to the manufacturing method of the present embodiment, the gap of the first layer 42 of the barrier metal portion 40 can be covered by the second layer 44 as described above. Therefore, when electrolytic plating is used, formation of the metal portion 50 in the gap by infiltration of the plating solution into the gap in the first layer 42 or corrosion of the conductive member due to the plating solution remaining in the gap can be suppressed.

Next, the barrier metal portion 40 and the metal portion 50 are patterned by a known semiconductor manufacturing process, and the through electrode 52 connected to the electrode layer 26 via the via-hole 36 is formed (FIG. 2H).

Next, a solder ball 54 as an external connection terminal is arranged on the through electrode 52 (FIG. 2I). If necessary, a solder resist (not illustrated) may be formed in a region other than the solder ball 54. Then, through a process such as dicing, the semiconductor device according to the present embodiment is completed.

As discussed above, according to the present embodiment, the coverability of the barrier metal portion 40 can be improved without decreasing productivity, and thereby, degradation in characteristics or reduction in reliability of a semiconductor device can be suppressed. Further, a film stress can be reduced without decreasing the metal diffusion prevention performance of the barrier metal portion 40. This can suppress peeling off of the conductive member from the side surface of the via-hole 36 or extension of cracks in the semiconductor element 16, the interlayer insulating films 20, 28, or the like on the surface side of the semiconductor substrate 10.

Second Embodiment

Figure 4:
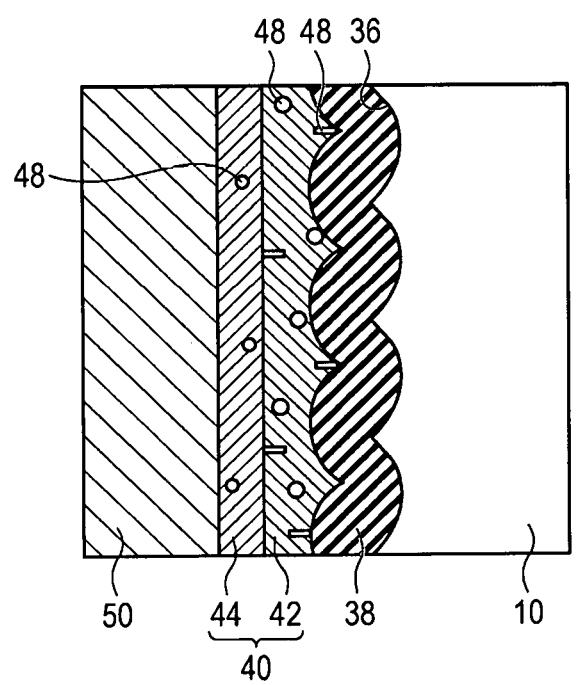
FIG. 4 is a schematic cross-sectional view illustrating a semiconductor device and a method of manufacturing the same according to a second embodiment of the present invention.

A semiconductor device and a method of manufacturing the same according to a second embodiment of the present invention will be described with reference to FIG. 4. Similar components to those of the first embodiment and the manufacturing method thereof illustrated in FIG. 1A to FIG. 3B are labeled with the same reference numerals, and the description thereof will be omitted or simplified. FIG. 4 is a schematic cross-sectional view illustrating a semiconductor device and a method of manufacturing the same according to the present embodiment.

A semiconductor device according to the present embodiment is the same as the semiconductor device according to the first embodiment illustrated in FIG. 1A except for a configuration of the barrier metal portion 40 being different. FIG. 4 is an enlarged view inside a frame surrounded by a dotted line in FIG. 1A.

The barrier metal portion 40 of the semiconductor device according to the present embodiment includes the first layer 42 and the second layer 44 as illustrated in FIG. 4. The first layer 42 is a film containing a large number of defects 48 inside and having a low film density, and the second layer 44 is a film containing fewer defects 48 than the first layer 42 and having a high film density. That is, the second layer 44 is denser than the first layer 42. In other words, the first layer 42 is coarser than the second layer 44. The defect 48 described here indicates a void, a pore, a pinhole, or the like, and is not a defect of atomic size such as an atomic vacancy, a dislocation, or the like. In terms of film stress, since a film having a large number of the defects 48 and a less film density results in a less film stress, the first layer 42 has less film stress than the second layer 44.

When the barrier metal portion 40 is formed of the first layer 42 only, the defect 48 inside the first layer 42 may penetrate the barrier metal portion 40 (the first layer 42), and the metal portion 50 and the insulating film 38 may be in contact with each other. On the other hand, by providing the second layer 44 on the first layer 42, it is possible to prevent the defect 48 from communicating through the barrier metal portion 40.

Since the defect 48 is hollow, it has an effect of suppressing diffusion of metal atoms in the same manner as the vacant gap 46 described in the first embodiment. Therefore, unless the defect 48 is formed to penetrate the barrier metal portion 40, the metal diffusion prevention performance of the barrier metal portion 40 is not impaired by the presence of the defect 48.

Further, the first layer 42 is formed of a film having a low film density and a low film stress, and thereby the film stress of the barrier metal portion 40 as a whole can be reduced while a high metal diffusion prevention performance is maintained.

Consequently, it is possible to suppress peeling off of the conductive member from the side surface of the via-hole 36 or extension of cracks in the semiconductor element 16, the interlayer insulating films 20, 28, or the like on the surface side of the semiconductor substrate 10.

The first layer 42 having a large number of the defects 48 and a low film density can be formed by a film deposition at a low temperature, for example. When the temperature of the stage on which the substrate is mounted is reduced, flow and rearrangement of the sputtered particles on the deposited surface are suppressed, and thereby the film having a large number of the defects 48 is formed. Alternatively, the porous first layer 42 having a large number of the defects 48 can be formed also by depositing the first layer 42 in a film forming environment containing a large amount of impurity such as moisture such that much moisture is released inside a chamber or from the surface of the substrate.

For example, in the process of forming the film to be the first layer 42, film deposition of the first layer 42 is performed at a stage temperature at 10° C. immediately after the semiconductor substrate 10 to be processed is introduced into the chamber, that is, with the moisture attached to the surface of the semiconductor substrate 10. On the other hand, in the process of forming the film to be the second layer 44, film deposition of a film to be the second layer 44 is performed at a stage temperature at 180° C. after the semiconductor substrate 10 to be processed is introduced into the chamber and after heat treatment is performed at 180° C. for 10 minutes to sufficiently remove the moisture attached on the surface of the semiconductor substrate 10. This enables formation of the first layer 42 containing a large number of defects 48 inside and having a low film density and the film to be the second layer 44 containing less defects 48 than the first layer 42 and having a high film density.

As discussed above, according to the present embodiment, the coverability of the barrier metal portion 40 can be improved without decreasing productivity, and thereby, degradation in characteristics or reduction in reliability of a semiconductor device can be suppressed. Further, a film stress can be reduced without decreasing the metal diffusion prevention performance of the barrier metal portion 40. This can suppress peeling off of the conductive member from the side surface of the via-hole 36 or extension of cracks in the semiconductor element 16, the interlayer insulating films 20, 28, or the like on the surface side of the semiconductor substrate 10.

Further, according to the first or second embodiment described above, a method of manufacturing a semiconductor device can be provided in which the method includes:

preparing a semiconductor substrate on which an electrode layer is formed over a first surface;

forming an opening that penetrates the semiconductor substrate from a second surface side opposite to the first surface of the semiconductor substrate and reaches the electrode layer;

forming a barrier metal portion along a side surface and a bottom surface of the opening; and forming a metal portion on the barrier metal portion, wherein the forming the barrier metal portion includes forming a first layer and forming a second layer that is denser than the first layer on the first layer.

Further, in the forming the barrier metal portion, a bias sputtering method may be used to deposit the first layer by applying a first bias voltage to the semiconductor substrate and to deposit the second layer by applying a second bias voltage that is higher than the first bias voltage to the semiconductor substrate.

Further, in the forming the barrier metal portion, the first layer may be deposited at a first temperature, and the second layer may be deposited at a second temperature that is higher than the first temperature.

Further, in the forming the opening, the Bosch method may be used to etch the semiconductor substrate.

Further, before the forming the barrier metal portion, it is also possible to further include forming an insulating film on the side surface of the opening.

Modified Embodiment

The present invention is not limited to the above embodiments, and various modifications are available.

For example, the configuration of the semiconductor device described in the above embodiments is not particularly limited and are applicable to various semiconductor devices such as a logic device, a memory device, an imaging device, and the like. Further, the semiconductor device described in the above embodiments is applicable to various electronic equipment. The electronic equipment is not particularly limited, for example, a digital still camera, a video camera, a smartphone, a personal computer, a household appliance (IoT), and the like can be illustrated as examples.

Further, the semiconductor device described in the above embodiments is also applicable to a transportation equipment having a moving apparatus. The semiconductor device of the present embodiment overcomes problems caused by metal diffusion or stress and can ensure high reliability even when mounted on a transportation equipment. For example, a transportation equipment can have a control apparatus for controlling a moving apparatus based on a signal output from the semiconductor device described in the above embodiments. For example, when a semiconductor device is a solid-state imaging device, it can be configured to calculate the distance to an object or the like based on a signal output from the photoelectric conversion element and to control the moving apparatus based on the calculated distance or the like. A moving apparatus is not particularly limited, and a power source or a propulsion mechanism such as an engine, a motor, a wheel, a propeller, or the like can be illustrated as an example. A transportation equipment is not particularly limited, and an airplane, a vehicle, a ship, or the like is illustrated as an example.

Further, each term in the present specification is merely used for the purpose of describing the present invention and can also contain the equivalents thereof, and the present invention is not limited to the strict meaning of that term.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-157581, filed Aug. 17, 2017 which is hereby incorporated by reference herein in its entirety.

What is claimed is:

1. A semiconductor device comprising:
   a semiconductor substrate;
   an electrode layer arranged over the semiconductor substrate; and
   a conductive member provided in an opening and electrically connected to the electrode layer, the opening penetrating the semiconductor substrate and reaching the electrode layer,
   wherein the conductive member includes a metal portion and a barrier metal portion provided between a side surface of the opening and the metal portion, and
   wherein the barrier metal portion includes a first layer and a second layer provided between the first layer and the metal portion, and the second layer is denser than the first layer.

2. The semiconductor device according to claim 1, wherein a vacant gap is provided between the second layer and the side surface.

3. The semiconductor device according to claim 2, wherein the first layer is discontinuous in a position where the vacant gap is provided.

4. The semiconductor device according to claim 2, wherein the vacant gap is covered with the second layer.

5. The semiconductor device according to claim 1, wherein the first layer has a larger number of defects than the second layer.

6. The semiconductor device according to claim 2, wherein a periodical concave and convex structure is provided on the side surface of the opening, and the vacant gap is provided on a position corresponding to a concave part of the side surface.

7. The semiconductor device according to claim 1, wherein the barrier metal portion is formed of a conductive material containing at least one selected from a group consisting of titanium, titanium nitride, tantalum, and tantalum nitride.

8. The semiconductor device according to claim 1, wherein the metal portion is formed of a metal material containing at least one selected from a group consisting of copper, gold, nickel, aluminum, and tungsten.

9. The semiconductor device according to claim 1, wherein an insulating film is arranged between the barrier metal portion and the side surface.

10. The semiconductor device according to claim 1, wherein an interlayer insulating film is arranged between the electrode layer and the semiconductor substrate.

11. The semiconductor device according to claim 1 further comprising a photoelectric conversion element arranged on the semiconductor substrate.

12. A transportation equipment comprising:
    a moving apparatus;
    the semiconductor device according to claim 11; and
    a control apparatus that controls the transportation equipment based on a signal output from the photoelectric conversion element of the semiconductor device.

13. A semiconductor device comprising:
    a semiconductor substrate;
    an electrode layer arranged over the semiconductor substrate; and
    a conductive member provided in an opening and electrically connected to the electrode layer, the opening penetrating the semiconductor substrate and reaching the electrode layer,
    wherein the conductive member includes a metal portion and a barrier metal portion provided between a side surface of the opening and the metal portion, and
    wherein a vacant gap is arranged between the metal portion and the side surface, and the barrier metal portion is arranged between the vacant gap and the metal portion.

14. The semiconductor device according to claim 13, wherein a periodical concave and convex structure is provided on the side surface of the opening, and the vacant gap is provided on a position corresponding to a concave part of the side surface.

15. The semiconductor device according to claim 13, wherein the barrier metal portion is formed of a conductive material containing at least one selected from a group consisting of titanium, titanium nitride, tantalum, and tantalum nitride.

16. The semiconductor device according to claim 13, wherein the metal portion is formed of a metal material containing at least one selected from a group consisting of copper, gold, nickel, aluminum, and tungsten.

17. The semiconductor device according to claim 13, wherein an insulating film is arranged between the barrier metal portion and the side surface.

18. The semiconductor device according to claim 13, wherein an interlayer insulating film is arranged between the electrode layer and the semiconductor substrate.

19. The semiconductor device according to claim 13 further comprising a photoelectric conversion element arranged on the semiconductor substrate.

20. A transportation equipment comprising:
    a moving apparatus;
    the semiconductor device according to claim 19; and a control apparatus that controls the transportation equipment based on a signal output from the photoelectric conversion element of the semiconductor device.

* * * * *